Feb. 6, 1968 J. A. WORCESTER 3,368,150

CONSTRUCTION FOR RADIOS AND THE LIKE

Filed Jan. 4, 1965

INVENTOR:
JOSEPH A. WORCESTER,

BY Norman C. Fulmer

HIS ATTORNEY.

United States Patent Office 3,368,150
Patented Feb. 6, 1968

3,368,150
CONSTRUCTION FOR RADIOS AND THE LIKE

Joseph A. Worcester, Frankfort, N.Y., assignor to General Electric Company, a corporation of New York Filed Jan. 4, 1965, Ser. No. 423,151
7 Claims. (Cl. 325—357)

This invention relates to the construction of radios and the like, and particularly relates to the construction of such devices having an intermediate-frequency amplifier. The invention will be particularly described as applied to an FM radio in which it is desired to have a high gain intermediate-frequency amplifier of compact size.

A typical FM receiver comprises a radio-frequency amplifier for tuning to and amplifying the received signals, followed by a converter circuit for converting the frequency of the received signals to a fixed intermediate frequency (10.7 megacycles per second, for example), which in turn is followed by an intermediate-frequency amplifier for amplifying the intermediate-frequency signal, followed by a detector and one or more audio-amplifier stages. The foregoing circuits and stages are mounted on a chassis such as a printed circuit board, along with batteries or other power supply source.

It is desirable that the intermediate-frequency amplifier have a high signal gain from input to output thereof, and to achieve the desired gain several sequential amplifier stages generally are provided. However, when such an amplifier is designed to have a desired high gain, of about 80 to 120 decibels for example, and also is designed to be compact in size such as can be achieved with the use of transistors, there occurs a serious problem of signal feedback of undesired magnitude from output to input of the amplifier, or from a later stage to an earlier stage within the amplifier, which feedback causes undesired oscillation of the amplifier stages involved. Such oscillation blocks the signal, and renders the amplifier insensitive. Not only is feedback of the 10.7 mc. intermediate-frequency signal a problem, but it has been found that undesired feedback of the ninth and the tenth harmonics of the 10.7 mc. IF frequency (which harmonics, at 96.3 and 107 mc., respectively, fall within the FM broadcast band of 88 to 108 mc.) can cause undesired "beats" when the receiver is tuned at or near these frequencies of 96.3 and 107 mc., which result in extraneous noises. These undesirable effects of feedback can be eliminated by spacing the amplifier stages and associated components far enough apart, usually in an elongated arrangement, so that the signal feedback is not great enough with respect to the forward gain of the amplifier to cause the undesired oscillation and beats to occur. Such an increased spacing of the amplifier stages does not, however, provide the compact and space-saving amplifier size that could otherwise be obtainable due to the small size of the transistors and other components used as the amplifying elements.

An object of the invention is to provide an improved construction for radios and the like.

Another object is to provide an improved construction for radios and the like wherein greater intermediate-frequency amplifier gain is achieved in a compact size.

A further object is to provide an improved construction for FM radios, which prevents undesired feedback of harmonics of the intermediate frequency falling within the FM broadcast band.

Still other objects will be apparent from the following description and claims, and from the accompanying drawing.

The invention comprises, briefly and in a preferred embodiment, a radio or like device having the various circuits thereof mounted on a chassis, these circuits including an intermediate-frequency amplifier having the stages thereof arranged sequentially in an elongated manner from the signal input end to the signal output end of this amplifier, and an elongated channel of electrically conductive material is positioned around the intermediate-frequency amplifier and is dimensioned so as to function as a wave-guide operating below its cut-off frequency with respect to the signal frequency of the intermediate-frequency amplifier, so as to attenuate feedback signals in the amplifier and thus prevent oscillation. Preferably, said cut-off frequency is high compared to any harmonics of the intermediate-frequency signal which fall within the tuning frequency band of the radio or like device in which the invention is embodied, so as to attenuate feedback of these harmonics and thus prevent "beats" of the harmonic signals with received signals. In a preferred construction of the invention, the aforesaid conductive channel is in the form of an open-sided metal channel mounted at its open side onto the circuit board of the radio or similar device, and the circuit board carries conductors printed thereon which are connected to the metal channel so as to effectively form therewith a four-sided electrically conductive channel, and the intermediate-frequency amplifier in carried by an auxiliary printed circuit board positioned within the metal channel.

Figure 1:
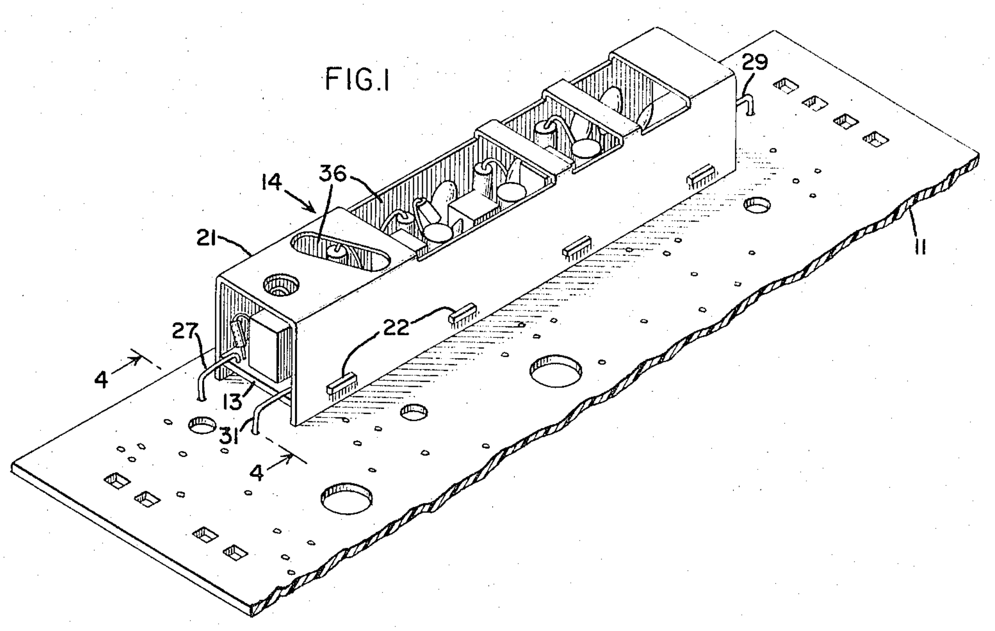
FIG. 1 is a perspective view of a preferred embodiment of the invention.
Figure 2:
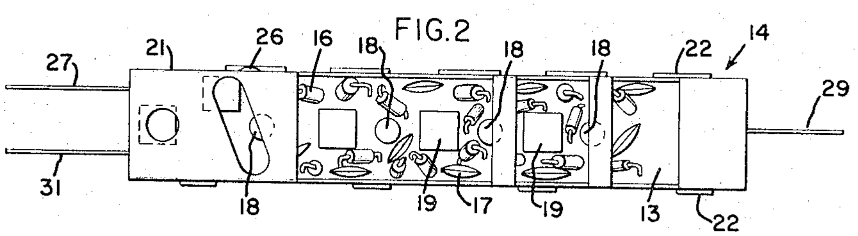
FIG. 2 is a top view of a portion of FIG. 1.
Figure 3:
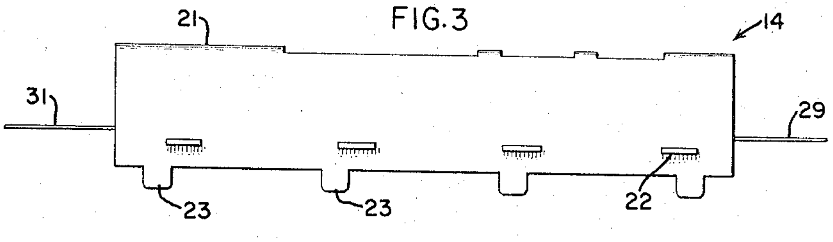
FIG. 3 is a side view of FIG. 2.
Figure 4:
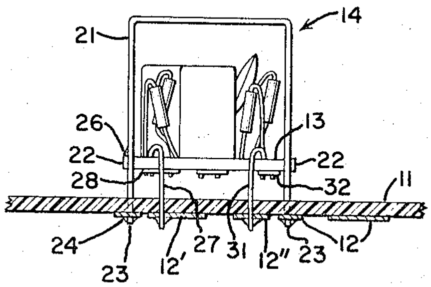
FIG. 4 is an end view of FIG. 1.

In the drawing, a circuit board 11 of a radio or like device carries various circuits, in a well-known manner, which constitute, for example, a radio-frequency amplifier, a converter circuit, an intermediate-frequency amplifier, a detector circuit, audio-amplifier stages, and power supply means for operating the circuits. The drawing shows an intermediate-frequency amplifier 14 constructed in accordance with the invention, which is mounted on the circuit board 11 along with the various other circuitry of the radio, this other circuitry and the mounting thereof on the circuit board 11 being well known and hence not being shown in the drawing. The circuit board 11 carries, on one or both surfaces thereof, printed or plated conductors 12 which function to interconnect various components of the radio.

The intermediate-frequency amplifier 14 comprises an auxiliary circuit board 13, having conductors printed or plated thereon in well-known manner, and has mounted thereon various components of the amplifier, such as resistors 16, capacitors 17, transistors 18, and intermediate-frequency signal coupling transformers 19. Each transistor 18 and associated components comprises one stage of the amplifier 14. If desired, the last stage can perform a limiter function, and a detector can also be included on the auxiliary circuit board 13.

A metal channel 21, having an open side at the bottom thereof, is positioned over and around the amplifier auxiliary circuit board 13 and the components carried thereon. Tabs 22 extend from the side edges of the auxiliary circuit board 13 and into or through suitable openings in the sides of the channel 21, whereby the channel 21 and auxiliary circuit board 13 are held together. Tabs 23 extend downwardly from the side portions of the channel 21, as shown. The amplifier 14 is mounted to the main circuit board 11 by means of the tabs 23 extending into or through suitable openings in the circuit board 11, as shown. Some or all of these tabs are soldered to printed conductors of the amplifier circuit board, indicated by the numeral 24. At least one of the printed conductors to which the tabs 23 are soldered on the main circuit board 11, is at electrical ground or other suitable reference potential, so that the metal channel 21 functions as a shield for the amplifier 14. The printed conductors to which the channel tabs 23 are soldered, as indicated at numeral 24, extend on the surface of the board 11 under the area thereof covered by the amplifier 14, either in a form of a continuous covering, or in the form of a pattern which extends under the area covered by the amplifier 14, so as to effectively act as an electrically conductive fourth side for the channel 21. One or more of the printed conductors on the auxiliary circuit board 13 extend onto the tabs 22 and are soldered to the metal channel as indicated at numeral 26, to provide a connection for operating voltage and also as a signal reference connection.

Suitable lead wires, for signals and operating voltage, extend from the auxiliary circuit board 13 and are soldered to various conductors 12 of the main circuit board 11. For example, a lead wire 27 is soldered between an input signal conductor 12′ on the main board 11 and is also soldered to a printed conductor 28 on the amplifier 14, so as to apply the intermediate-frequency input signal to the amplifier. Similarly, a lead wire 29 is connected for conveying the output signal from the amplifier 14 to the main circuit board 11, and a lead wire 31 is soldered to a conductor 12″ on the main circuit board 11, which carries operating voltage, and the wire 31 also is soldered to a conductor 32 on the auxiliary board 13 so as to apply operating voltage thereto. The return connection for the input and output signals, and for the operating voltage, is provided between the amplifier and the main circuit board 11 by means of the aforesaid connection 26 of the auxiliary board conductors to the channel 21, and from the connection 24 of the channel 21 to appropriate conductors 12 of the main circuit board 11.

The width of the metal channel 21 is made such that the channel 21 functions as a wave guide operating at a frequency below its cut-out frequency with respect to the 10.7 mc. signal frequency of the amplifier 14 and disturbing harmonics thereof. As is well known, a wave guide attenuates the passage of signals in the cut-off region below its cut-off frequency, by an amount of approximately 30 decibels for a length of wave guide equal to the width thereof. This attenuation for the feedback signals is greater than that which would occur with the amplifier 14 mounted on the relatively larger circuit board chassis 11 without the benefit of the metal channel 21.

For a transistorized intermediate-frequency amplifier as shown in the drawing, and operating at 10.7 megacycles signal frequency, a suitable width for the channel 21 is ¾ inch, and the height thereof may conveniently be the same as its width. This amplifier, comprising three stages of intermediate-frequency signal amplification and one stage limiter-amplifier, has a length of approximately 4 inches, and thus is relatively short and compact as compared to the necessary greater length that would be required without using the invention. For amplifiers of equal length with and wtihout the invention, use of the invention permits 20 db more gain than for the amplifier without the invention.

The invention is found to apply ideally to a transistorized IF amplifier, in which the gain is typically about 20 or 24 db per stage, and, since the attenuation of feedback signal achieved by the use of the channel member 21 is 30 db per ¾ inch of length of the amplifier, the transistors 18 in the amplifier may be spaced apart ¾ inch from one to the other, thus achieving a convenient and compact arrangement for the amplifier.

From the foregoing it will be realized that I have achieved an improved construction for radios and the like, by providing an electrically conductive channel covering for an intermediate-frequency amplifier which channel is dimensioned to function (with respect to the amplifier frequency) as a wave guide in its cut-off region, thereby achieving compact amplifier construction and preventing undesired signal feedback, whereas without the invention the circuit board 11 of the radio or like device, which functions as a carrier for feedback signals adjacent to the surface thereof from output to input of the amplifier and which necessarily has large enough width so as to cause an undesired magnitude of signal feedback at the frequencies involved, would require careful designing and a larger-size arrangement of the intermediate-frequency amplifier.

The principles of waveguide in an amplifier, which heretofore have been considered as an undesired problem, are described in the Radiation Laboratory Series, published by the Massachusetts Institute of Technology, in the volume Vacuum Tube Amplifiers, by Valley & Wallman, 1948, on page 325. However, in accordance with my invention, I have devised a construction in which the waveguide technique is used advantageously in combination with an intermediate-frequency amplifier mounted on a circuit board along with other circuits of a radio or like device such as a television set.

If desired, openings 36 may be provided in the channel 21 to provide access for adjustment of the IF transformers 19, or for making circuit inspection or repairs. It has been found that it is feasible to provide a sufficient number of such openings, of sufficient size, to achieve adjustment and inspection and repairs of the amplifier 14, without degrading the objects of the invention. The exact size and number of such openings that can be provided can readily be determined by experiment.

While a preferred embodiment of the invention has been shown and described, various other embodiments and modifications thereof will be apparent to those skilled in the art, and will fall within the scope of invention as defined in the following claims.

What I claim is:

1. A construction for radios and the like having the circuits thereof mounted on a chassis, said circuits including a multi-stage intermediate-frequency amplifier mounted on a portion of said chassis, said construction comprising an elongated sequential arrangement of said stages of the amplifier, and an elongated channel of electrically conductive material positioned around said amplifier, said channel being narrower than the width of said chassis and being dimensioned to function as a waveguide operating below its cut-off frequency with respect to the signal frequency of said intermediate-frequency amplifier so as to attenuate undesired feedback signals of said amplifier to a magnitude less than would occur from feedback caused by said chassis.

2. A construction for radios and the like tunable over a frequency band and having the circuits thereof mounted on a chassis, said circuits including a multi-stage intermediate-frequency amplifier mounted on a portion of said chassis and operable at a given signal frequency of which a harmonic thereof falls within said frequency band, said construction comprising an elongated sequential arrangement of said stages of the amplifier and an elongated channel of electrically conductive material positioned around said amplifier, said channel being narrower than the width of said chassis and being dimensioned to function as a wave-guide operating below its cut-off frequency with respect to both said given signal frequency and said harmonic thereof so as to attenuate undesired feedback of signals at said given frequency and said harmonic thereof to a magnitude less than would occur from feedback caused by said chassis.

3. A construction for radios and the like having the circuits thereof mounted on a main chassis, said circuits including a multi-stage intermediate-frequency amplifier mounted on a portion of said chassis, said construction comprising an elongated auxiliary chassis carrying the stages of said amplifier in an elongated sequential arrangement, an elongated channel of electrically conductive material positioned around said auxiliary chassis and the stages carried thereby, and means for mounting said auxiliary chassis and channel to said main chassis, said channel being narrower than the width of said main chassis, and being dimensioned to function as a waveguide operating below its cut-off frequency with respect to the signal frequency of said intermediate-frequency amplifier so as to attenuate undesired feedback signals of said amplifier to a magnitude less than would occur from feedback caused by said main chassis.

4. A construction as claimed in claim 3, in which said auxiliary chassis is provided with tabs extending from the sides thereof and in which said channel is U-shaped and is provided with openings in the sides thereof adapted to receive said tabs, said auxiliary chassis and channel being assembled and held together by means of said tabs extending in said openings, the sides of said channel being provided with tabs extending downwardly therefrom, said main chassis being provided with openings adapted to receive said downwardly extending tabs, and said auxiliary chassis and channel being mounted to said main chassis by means of said downwardly extending tabs extending into said openings in the main chassis and being attached thereto.

5. A construction as claimed in claim 3, in which said channel is U-shaped and is mounted with the open side thereof toward said main chassis and in which said main chassis comprises electrically conductive material under the area of said amplifier, and means electrically connecting said channel to said electrically conductive material.

6. A construction as claimed in claim 4, in which said main chassis comprises electrically conductive material under the area of said amplifier, and including means for attaching said channel tabs to said electrically conductive material.

7. A construction as claimed in claim 4, in which said auxiliary chassis comprises a conductor on the surface thereof extending onto at least one of said tabs of the auxiliary chassis, means connecting said conductors to said channel, and in which said main chassis comprises a conductor at at least one of said openings therein, and means connecting at least one of said channel tabs to said conductors of the main chassis, thereby providing an electrical connection between the main chassis and the auxiliary chassis.

No references cited.

WILLIAM C. COOPER, *Primary Examiner.*

R. S. BELL, *Assistant Examiner.*